(12) United States Patent
Kuo

(10) Patent No.: US 9,184,348 B2
(45) Date of Patent: Nov. 10, 2015

(54) LIGHT EMITTING DIODE STRUCTURE

(71) Applicant: Lextar Electronics Corporation, Hsinchu (TW)

(72) Inventor: Shiou-Yi Kuo, Kaohsiung (TW)

(73) Assignee: Lextar Electronics Corporation, Hsinchu (TW)

( * ) Notice: Subject to any disclaimer, the term of this patent is extended or adjusted under 35 U.S.C. 154(b) by 31 days.

(21) Appl. No.: 14/089,948

(22) Filed: Nov. 26, 2013

(65) Prior Publication Data

US 2014/0367635 A1    Dec. 18, 2014

(30) Foreign Application Priority Data

Jun. 14, 2013   (TW) .............................. 102121149 A

(51) Int. Cl.
*H01L 33/00* (2010.01)
*H01L 33/42* (2010.01)
*H01L 33/38* (2010.01)

(52) U.S. Cl.
CPC ................ *H01L 33/42* (2013.01); *H01L 33/38* (2013.01)

(58) Field of Classification Search
CPC ............ H01L 51/0067; H01L 51/0072; H01L 51/5044; H01L 51/506; H01L 51/5265; H01L 51/5268; H01L 51/5278; H01L 51/5068; H01L 51/5064; H01L 51/0085; H01L 51/0071; H01L 51/5218; H01L 51/0061; H01L 51/0052; H01L 51/5092; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254

USPC ......... 257/12–13, 40, 81, 84, 87–89, 98–100, 257/347–348, 433–434; 313/112, 501, 503, 313/506–507
See application file for complete search history.

(56) References Cited

U.S. PATENT DOCUMENTS

| | | | |
|---|---|---|---|
| 6,791,119 B2 | 9/2004 | Slater | |
| 7,999,273 B2* | 8/2011 | Tsai et al. ........................ | 257/95 |
| 2007/0290188 A1* | 12/2007 | Chuo et al. ...................... | 257/13 |
| 2011/0089450 A1* | 4/2011 | Jeong et al. ...................... | 257/98 |
| 2011/0090697 A1* | 4/2011 | Matsuzaki et al. ............. | 362/293 |
| 2011/0121334 A1* | 5/2011 | Dai et al. ......................... | 257/98 |
| 2011/0290322 A1* | 12/2011 | Meguro et al. ................. | 136/256 |
| 2014/0203318 A1* | 7/2014 | Matsui et al. ................... | 257/98 |

FOREIGN PATENT DOCUMENTS

TW    483205 B2   4/2002
TW    200514281 A   4/2005

* cited by examiner

*Primary Examiner* — Dung Le
(74) *Attorney, Agent, or Firm* — Moser Taboada

(57) ABSTRACT

An LED structure includes a substrate, an emitting multilayer structure, a plurality of microstructures and a transparent conductive layer. The emitting multilayer structure is formed on the substrate. The microstructures are spaced apart from each other on the light emitting multilayer structure, and an upper surface of each microstructure has a concave-convex surface. The transparent conductive layer is conformably covered over the light emitting multilayer structure and the microstructures. The transparent conductive layer has similar concave-convex surfaces due to the concave-convex surface of each microstructure. The light emitted from the emitting multilayer structure is changed due to the concave-convex surface of the transparent conductive layer, so that the phenomenon of total internal reflection can be reduced so as to increase the light transmittance.

8 Claims, 5 Drawing Sheets

LIGHT EMITTING DIODE STRUCTURE

RELATED APPLICATIONS

The present application is based on, and claims priority from, Taiwan Application Serial Number 102121149, filed on Jun. 14, 2013, the disclosure of which is hereby incorporated by reference herein in its entirety.

BACKGROUND

1. Field of Invention

The present invention relates to a light emitting device. More particularly, the present invention relates to a light emitting diode structure.

2. Description of Related Art

A light-emitting diode has its characteristics of generating considerable brightness with low power. It can not only serve as a screen backlighting but also be used as the light-emitting element in a variety of lighting fixtures, such as light bulbs, lamps, tubes, plate lights, street lights and a variety of advertising signs and other kinds of lamps.

In order to save energy, manufacturers hope to make some powerful light-emitting diodes to produce greater brightness, such that the light-emitting diode structure has a constant innovative research and development, thereby changing the structure of light-emitting diodes to increase the light transmittance so as to enable the light emitting diode to be brighter.

A conventional light emitting diode structure contains an n-type conductive layer, a light emitting layer, and a p-type conductivity layer, and also includes different forms of current blocking layers, transparent conductive layers and electrodes according to different design purposes. FIG. 1 illustrates a top view of a conventional LED 50, and FIG. 2 illustrates a cross-sectional view of the conventional LED taken along A-A' in FIG. 1. As illustrated in FIGS. 1 and 2, the conventional LED 50 has a transparent conductive layer 53, a p-electrode 55 and an n-electrode 56 on its upper surface. When the light emitted from the emitting multilayer structure 52 goes through an interface between the transparent conductive layer 53 and air, most of the light does not go out of the LED chip due to the total internal reflection. The light-emitting diode has a total reflection angle of about 24.5 degrees for an air interface. The total reflection at the interface between the transparent conductive layer and the air causes a lower light extraction rate, that is, only part of the light goes outside of the LED chip, but a large majority of the light is entrapped within the LED chip and finally converted into heat. Therefore, there is a need for manufacturers to innovate the light emitting diode structure so as to improve the light extraction.

SUMMARY

It is therefore an objective of the present invention to provide an improved light emitting diode structure of better light transmittance.

In accordance with the foregoing and other objectives of the present invention, an LED structure includes a substrate, an emitting multilayer structure, a plurality of microstructures and a transparent conductive layer. The emitting multilayer structure is formed on the substrate. The microstructures are spaced apart from each other on the light emitting multilayer structure, and an upper surface of each microstructure has a concave-convex surface. The transparent conductive layer is conformably covered over the light emitting multilayer structure and the microstructures.

In another embodiment disclosed herein, the emitting multilayer structure includes a first type semiconductor layer, an active layer and a second type semiconductor layer.

In another embodiment disclosed herein, the microstructures are made from oxides.

In another embodiment disclosed herein, the oxides include $TiO_2$, $SiO_2$, $Si_3N_4$, $Ta_2O_5$, $Al_2O$ or combinations thereof.

In another embodiment disclosed herein, the LED structure further includes a first type electrode formed on the transparent conductive layer.

In another embodiment disclosed herein, a bottom surface of the microstructure is getting larger when being closer to the first type electrode.

In another embodiment disclosed herein, an interval between adjacent two of the microstructures is getting shorter when being closer to the first type electrode.

In another embodiment disclosed herein, the LED structure further includes a current block layer formed under the first type electrode and by the same process way as the microstructures over the emitting multilayer structure.

In another embodiment disclosed herein, the microstructure and the current block layer are made from the same materials.

In another embodiment disclosed herein, the active layer includes a multiple quantum well layer.

In another embodiment disclosed herein, the concave-convex surface has a surface roughness ranging from 0.1 nm to 1.1 nm.

In accordance with the foregoing and other objectives of the present invention, an LED structure manufacturing method including the steps of providing a substrate; forming an emitting multilayer structure on the substrate; simultaneously forming a current block layer and a plurality of microstructures that are spaced apart from each other on the emitting multilayer structure, wherein each microstructure has a concave-convex surface; forming a transparent conductive layer conformably over an upper surface of the emitting multilayer structure and the microstructures; and forming a first type electrode on the transparent conductive layer and aligned with the current block layer under the transparent conductive layer.

In another embodiment disclosed herein, the current block layer and the microstructures are formed by the same lithography and etching processes.

In another embodiment disclosed herein, the current block layer and the microstructures are made from oxides.

In another embodiment disclosed herein, the current block layer and the microstructures are made from $TiO_2$, $SiO_2$, $Si_3N_4$, $Ta_2O_5$, $Al_2O$ or combinations thereof.

In another embodiment disclosed herein, the emitting multilayer structure includes a first type semiconductor layer, an active layer and a second type semiconductor layer.

In another embodiment disclosed herein, the active layer includes a multiple quantum well layer.

In another embodiment disclosed herein, the concave-convex surface has a surface roughness ranging from 0.1 nm to 1.1 nm.

In another embodiment disclosed herein, a bottom surface of the microstructure is getting larger when being closer to the first type electrode.

In another embodiment disclosed herein, an interval between adjacent two of the microstructures is getting shorter when being closer to the first type electrode.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
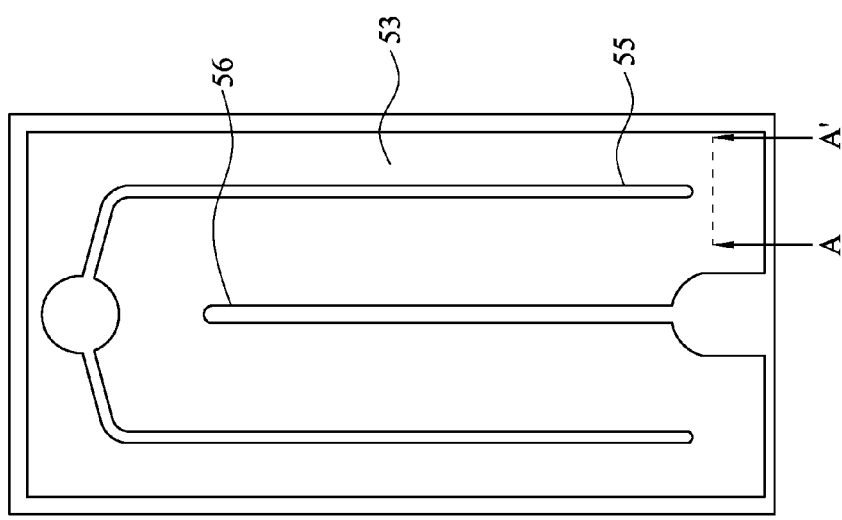
FIG. 1 illustrates a top view of a conventional LED.
Figure 2:
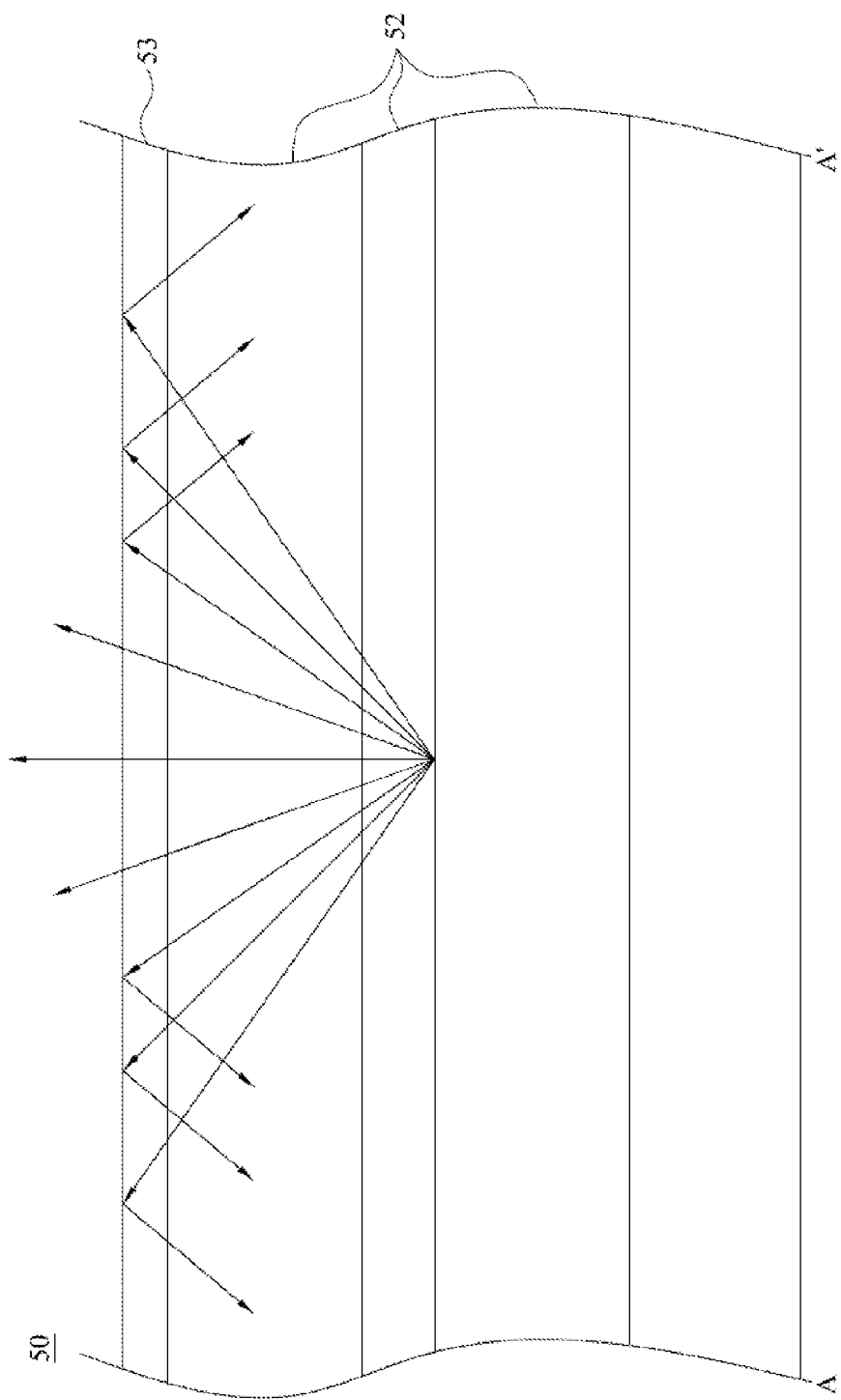
FIG. 2 illustrates a cross-sectional view of the conventional LED taken along A-A' in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3B:
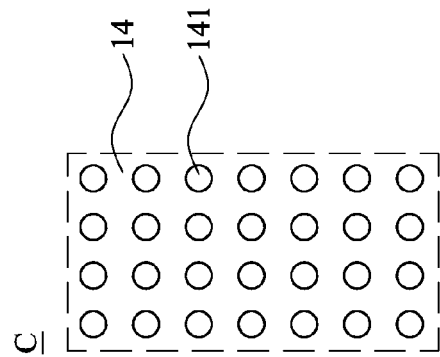
FIG. 3B illustrates an enlarged view of a portion C in FIG. 3A.
Figure 3A:
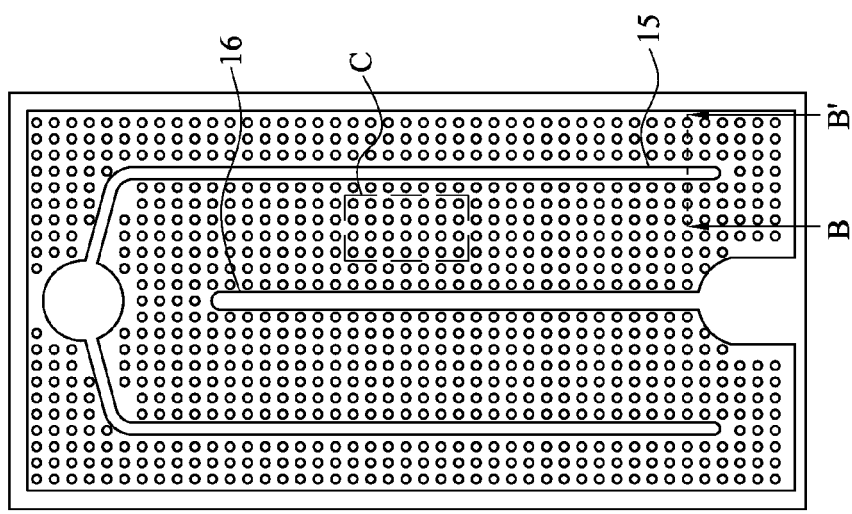
FIG. 3A illustrates a top view of a LED according to an embodiment of this invention.
Figure 4:
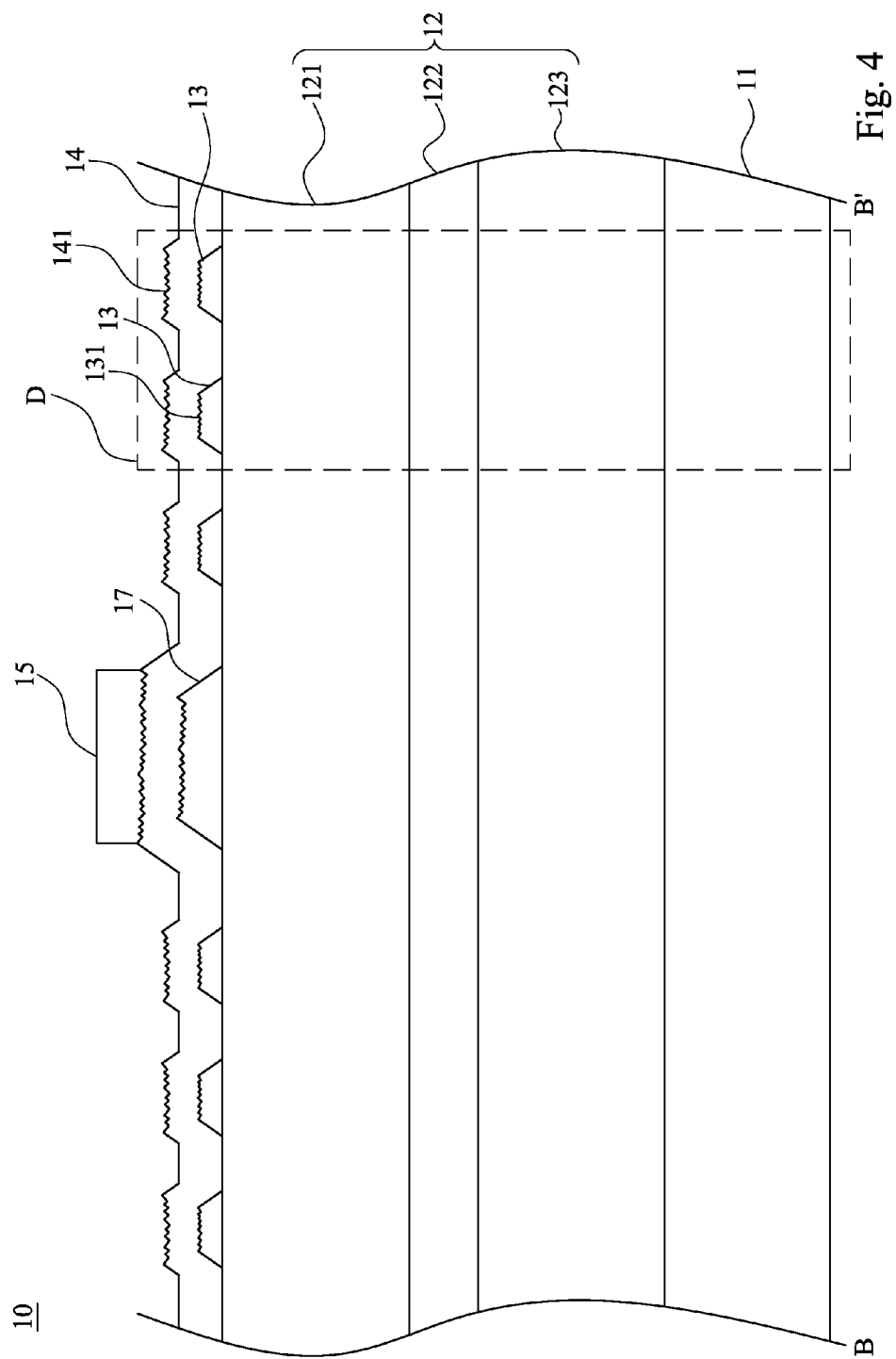
FIG. 4 illustrates a cross-sectional view of the LED taken along B-B' in FIG. 3A.
Figure 5:
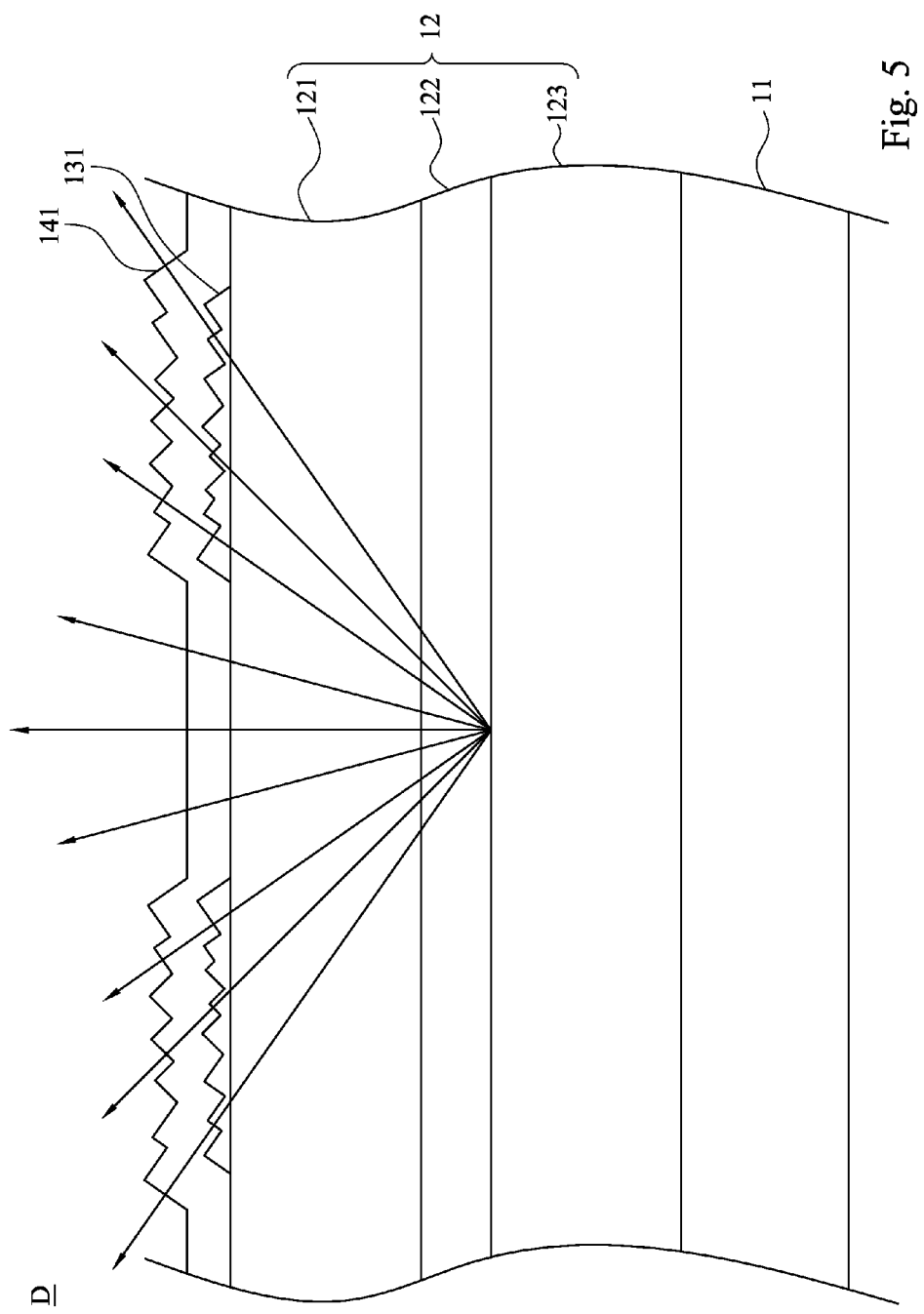
FIG. 5 illustrates an enlarged view of a portion D in FIG. 4.

Referring to FIGS. 3-5, an LED structure 10 disclosed herein includes a substrate 11, an emitting multilayer structure 12, a plurality of microstructures 13 and a transparent conductive layer 14. The emitting multilayer structure 12 is formed on the substrate 11. The microstructures 13 are spaced apart from each other on the emitting multilayer structure 12, and each microstructure 13 has a concave-convex surface 131. The transparent conductive layer 14 is conformably formed over an upper surface of the emitting multilayer structure 12 and the microstructures 13. In this regard, the transparent conductive layer 14, which is conformably formed over the concave-convex surface 131, has a similar concave-convex surface 141. The light emitted from the emitting multilayer structure 12 is changed (i.e., refracted) in its course due to the concave-convex surface 141 (as illustrated in FIG. 5) such that the light can go through the transparent conductive layer 14 with less or without the phenomenon of total internal reflection so as to increase the light transmittance.

Referring to FIG. 4, in an embodiment of this invention, the emitting multilayer structure 12 includes a first type semiconductor layer 121, an active layer 122 and a second type semiconductor layer 123, wherein the first type semiconductor layer 121 is a p-type semiconductor layer while the second type semiconductor layer 123 is a n-type semiconductor layer. In addition, the active layer 122 includes a multiple quantum well layer, and a concave-convex surface 131 of the microstructure 13 has a surface roughness ranging from 0.1 nm to 1.1 nm. In this embodiment, the LED structure is a typical LED structure, but can also be a vertical type LED structure.

According to an embodiment of this invention, the microstructures 13 are made from oxides, which may includes $TiO_2$, $SiO_2$, $Si_3N_4$, $Ta_2O_5$, $Al_2O$ or combinations thereof.

Referring to FIG. 3 and FIG. 4, the LED structure 10 may further include a first type electrode 15 and a second type electrode 16, wherein the first type electrode 15 is formed on the transparent conductive layer 14. A bottom surface of the microstructure 13 is getting larger when (the microstructure 13) being closer to the first type electrode 15. In addition, an interval between adjacent two of the microstructures 13 is getting shorter when (adjacent two of the microstructures 13) being closer to the first type electrode 15. Due to changes on the bottom surface of the microstructures 13 or the interval between adjacent two of the microstructures 13, electrical currents can be avoided to crowd under the first type electrode 15 and can be evenly spread over the transparent conductive layer 14 such that the phenomenon of total internal reflection can be reduced on the current block layer 17 so as to increase the light transmittance.

According to another embodiment of this invention, an additional current block layer 17 may be formed under the first type electrode 15 by the same way as the microstructure 13 (e.g., the same lithography and etching processes) and above the emitting multilayer structure 12, wherein the microstructure 13 and the current block layer 17 can be made from the same materials, that is, the current block layer 17 can also be from $TiO_2$, $SiO_2$, $Si_3N_4$, $Ta_2O_5$, $Al_2O$ or combinations thereof.

According to another aspect of this invention, a LED structure manufacturing method includes the following steps: (1) providing a substrate 11; (2) forming an emitting multilayer structure 12 on the substrate 11; (3) simultaneously forming a current block layer 17 and a plurality of microstructures 13, which are spaced apart from each other, on the emitting multilayer structure 12, wherein each microstructure 13 has a concave-convex surface; (4) conformably forming a transparent conductive layer 14 over an upper surface of the emitting multilayer structure 12 and the microstructures 13; and (5) forming a first type electrode 15 on the transparent conductive layer 14 and aligned with the current block layer 17 under the transparent conductive layer 14. In this regard, the present invention provides a manufacturing method to form the microstructures 13 and the current block layer 17 simultaneously, thereby reducing the total internal reflection of the current block layer 17 and spreading the electrical currents evenly so as to increase the light transmittance.

In particular, the LED structure manufacturing method is to form a sapphire substrate 11 first. Next, a MOCVD (Metal-organic Chemical Vapor Deposition) process is used to form the emitting multilayer structure 12. A PECVD (Plasma-enhanced chemical vapor deposition) process is used to form a layer of the microstructures 13 and/or the current block layers 17, and a photolithography and etching process is used to remove unnecessary portions so as to form the microstructures 13 and/or the current block layers 17 at predetermined positions. Next, the transparent conductive layer can be formed by an E-Gun vacuum deposition process or a sputtering process, and the first type electrode 15 and the second type electrode 16 can be finally formed by E-Gun vacuum deposition process, thereby forming a typical LED structure in this embodiment. In an embodiment, the microstructures 13 and the current block layer 17 can be made from, but not being limited to, the same materials. In another embodiment, the microstructures 13 and the current block layer 17 can be formed by the same lithography and etching processes using the same materials, but not being limited to. In still another embodiment, the microstructures 13 and the current block layer 17 can be formed by different lithography and etching processes using different materials respectively. In addition, it is noted that the current block layer 17 may not be a necessary part of the LED structure, and the LED structure equipped with the microstructures 13 but without the current block layer 17 still achieve the purpose of this invention.

According to another embodiment of this invention, the emitting multilayer structure 12 includes a first type semiconductor layer 121, an active layer 122 and a second type semiconductor layer 123, wherein the first type semiconductor layer 121 is a p-type semiconductor layer while the second type semiconductor layer 123 is an n-type semiconductor layer. In addition, the active layer 122 includes a multiple quantum well layer, and the concave-convex surface 131 of each microstructure 13 has a surface roughness ranging from 0.1 nm to 1.1 nm, wherein the surface roughness of microstructure can be adjusted by tuning process parameters. According to another embodiment of this invention, the emitting multilayer structure can be formed by MOCVD (Metal-organic Chemical Vapor Deposition) process to form a first type semiconductor layer 121, the active layer 122 and the second type semiconductor layer 123, wherein a surface roughness of the microstructure can be adjusted by tuning process parameters to range from 0.1 nm to 1.1 nm.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An LED structure comprising:
    a substrate;
    an emitting multilayer structure disposed on the substrate;
    a plurality of microstructures spaced apart from each other on the emitting multilayer structure, and each microstructure comprising a first concave-convex surface, wherein the first concave-convex surface has a surface roughness ranging from 0.1 nm to 1.1 nm;
    a transparent conductive layer conformably formed on a first overall upper surface of the emitting multilayer structure and the microstructures so as to form a second overall upper surface with a plurality of second concave-convex surfaces, each second concave-convex surface is aligned with a corresponding one of the first concave-convex surfaces; and
    a first type electrode formed on the transparent conductive layer, wherein a bottom surface of the microstructure is getting larger when being closer to the first type electrode.

2. The LED structure of claim 1, wherein the emitting multilayer structure comprises a first type semiconductor layer, an active layer and a second type semiconductor layer.

3. The LED structure of claim 1, wherein the microstructures are made from oxides.

4. The LED structure of claim 3, wherein the oxides comprise $TiO_2$, $SiO_2$, $Si_3N_4$, $Ta_2O_4$, $Al_2O$ or combinations thereof.

5. The LED structure of claim 1, wherein an interval between adjacent two of the microstructures is getting shorter when being closer to the first type electrode.

6. The LED structure of claim 1, further comprising a current block layer formed under the first type electrode and by the same process way as the microstructures over the emitting multilayer structure.

7. The LED structure of claim 6, wherein the microstructure and the current block layer are made from the same materials.

8. The LED structure of claim 2, wherein the active layer comprises a multiple quantum well layer.

* * * * *